United States Patent [19]
Moriarty, Jr.

[11] Patent Number: 5,867,067
[45] Date of Patent: Feb. 2, 1999

[54] CRITICALLY-BIASED MOS CURRENT MIRROR

[75] Inventor: John K. Moriarty, Jr., Reading, Pa.

[73] Assignee: Lucent Technologies Inc., Murray Hill, N.J.

[21] Appl. No.: 791,798

[22] Filed: Jan. 29, 1997

[51] Int. Cl.$^6$ .................................................... H03F 3/16
[52] U.S. Cl. ......................................... 330/288; 323/315
[58] Field of Search ............................. 330/288; 323/315, 323/316

[56] References Cited

U.S. PATENT DOCUMENTS

| | | | |
|---|---|---|---|
| 3,936,725 | 2/1976 | Schneider | 330/288 X |
| 4,471,292 | 9/1984 | Schenck et al. | 330/288 X |
| 4,477,782 | 10/1984 | Swanson . | |
| 4,550,284 | 10/1985 | Sooch . | |
| 4,983,929 | 1/1991 | Real et al. | 330/288 |
| 5,386,200 | 1/1995 | Limberg | 330/288 |

*Primary Examiner*—James B. Mullins

[57] ABSTRACT

The input branch of the current mirror is responsive to a single input signal current and each output branch of the current mirror mirrors the input signal current to produce an output current proportional to (e.g., substantially equal to) the input signal current. In one embodiment, the input branch has an input mirror MOS transistor connected to a threshold voltage generator, the output branch has an output mirror MOS transistor connected in cascode to an output cascode MOS transistor, and all of the transistors operate in saturation. The threshold voltage generator may be implemented in different ways, including using four MOS transistors forming two current paths, such that, in one current path, two transistors have channel constants of X and 4X, respectively, and, in another current path, two transistors both have channel constants of A, which may be different from X. In this implementation, the input and output mirror transistors have channel constants of B, which may be different from X and A, and the output cascode transistor has a channel constant of 4X+A.

18 Claims, 12 Drawing Sheets

CRITICALLY-BIASED MOS CURRENT MIRROR

BACKGROUND OF THE INVENTION

1. Field of the Invention

The present invention relates to integrated electronic circuits, and, in particular, to current mirrors.

2. Description of the Related Art

A current mirror is a type of current amplifier that provides a high impedance output current proportional to an input signal current. The output current may be used, for example, to drive a load for high gain.

FIG. 1 shows a representation of a simple current mirror 100 consisting of a single input transistor 102 and a single output transistor 104, with the gate electrodes G of the pair being tied together and to an input voltage node V which is common to both. The sources of the transistors are connected to a reference voltage node which is common to both (e.g., ground). The drain and the gate of the input transistor are connected to an input signal current source $I_{IN}$ that provides a reference current. Because the input and output transistors have their gates tied together and their sources tied together, a corresponding output current $I_{OUT}$ arises in the conduction path of the output transistor. In some current mirrors, the input and output transistors are identical (e.g., have the same width-to-length ratio) and there is a substantially unity gain in the current. Such current mirrors are commonly used to provide active loads in high-gain amplifier stages. Unfortunately, the output impedance of such current mirrors is too low for many applications.

U.S. Pat. No. 4,477,782 (Swanson), the teachings of which are incorporated herein by reference, discloses current mirrors in which two input signal currents are used to generate the output current. In certain applications, it may be inefficient to use a current mirror that uses two input signal currents.

U.S. Pat. No. 4,550,284 (Sooch), the teachings of which are incorporated herein by reference, discloses current mirrors in which, during operation, some of the transistors are in the saturation region, while other transistors are in the triode region. In order to ensure proper operation, the transistor model parameters in Sooch need to be consistent from transistor to transistor.

It is an aspect of the present invention to provide a current mirror that does not suffer from the limitations of the prior art of having either two input signal currents or transistors that operate in different regions.

Further aspects and advantages of this invention will become apparent from the detailed description which follows.

SUMMARY OF THE INVENTION

Embodiments of the present invention are directed to a current mirror having an input circuit branch and an output circuit branch, wherein the input branch is responsive to a single input signal current and the output branch mirrors the input signal current to produce an output current substantially proportional to the input signal current. The input branch comprises an input mirror device and a threshold voltage generator, connected to the input mirror device. The output branch comprises an output mirror device and an output cascode device, connected in cascode with the output mirror device. The input mirror device, the output mirror device, and the output cascode device all operate in saturation.

According to other embodiments, the present invention is directed to a current mirror, having an input circuit branch and an output circuit branch, wherein the input branch is responsive to a single input signal current and the output branch mirrors the input signal current to produce an output current substantially proportional to the input signal current. The input branch comprises at least five input transistors, each input transistor having a gate, a source, and a drain, wherein:

(1) the drain of the first input transistor is connected to the source of the second input transistor and the source of the fourth input transistor;

(2) the gate of the first input transistor is connected to both the drain of the second input transistor and the source of the third input transistor;

(3) the gate of the second input transistor is connected to the gate of the fourth input transistor, the drain of the fourth input transistor, and the source of the fifth input transistor; and (4) the gate and the drain of the third input transistor and the gate and the drain of the fifth input transistor are interconnected and are responsive to the input signal current.

The output branch comprises a first output transistor connected in cascode to a second output transistor, each output transistor having a gate, a source, and a drain, wherein:

(1) the gate of the first output transistor is connected to the gate of the first input transistor, (2) the drain of the first output transistor is connected to the source of the second output transistor; and (3) the gate of the second output transistor is connected to the gate of the second input transistor.

According to still other embodiments, the present invention is directed to a current mirror including an input circuit branch and an output circuit branch, wherein the input branch is responsive to a single input signal current and the output branch mirrors the input signal current to produce an output current substantially proportional to the input signal current. The input branch comprises an input mirror transistor and a threshold voltage generator, connected in cascode to the input mirror transistor and comprising at least four generator transistors. The output branch comprises an output mirror transistor and an output cascode transistor, connected in cascode with the output mirror transistor. The input mirror transistor has a channel constant of B; the first generator transistor has a channel constant of 4X; the second generator transistor has a channel constant of approximately X; the third generator transistor has a channel constant of A; the fourth generator transistor has a channel constant of approximately A; the output mirror transistor has channel constant of approximately B; and the output cascode transistor has a channel constant of approximately 4X+A.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
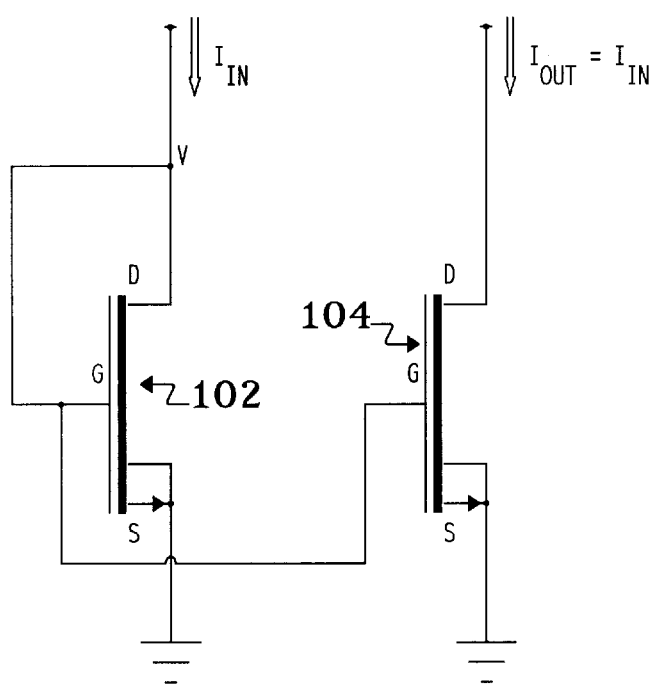
FIG. 1 shows a representation of a prior-art current mirror.

Embodiments of the present invention are directed to current mirrors in which a single input signal current is used to generate an output current and all of the devices of the current mirror operate in the saturation region. Those skilled in the art will understand that for current mirrors based on metal oxide semiconductor (MOS) transistor technology, saturation is the same as the forward active mode of the transistors. Current mirrors of the present invention are designed to ensure that the voltage applied to the drain of the output mirror device of such a current mirror is the "on" voltage $V_{ON}$ that keeps the output mirror device operating in the forward active mode. A threshold voltage generator in the input path is used to ensure that the appropriate voltages are applied throughout the current mirror.

As MOS gate lengths shrink, the output impedance of MOS current mirrors also decreases due to more pronounced channel-length modulation effects. One way of increasing the output impedance of MOS current mirrors is to use a cascode transistor in the output path to reduce the drain voltage variation of the output mirror transistor. It is desirable to minimize the total operating headroom required by the combination of the output mirror transistor and the output cascode transistor in order to accommodate the maximum range of output voltages. It is an object of this invention to generate the minimum possible bias voltage for the gate of the output cascode transistor that guarantees that the output mirror transistor will remain in the forward active mode.

A simple model relating the output current to the input voltage for MOS transistors is given by Equation (1) as follows:

$$I_D = K(W/L)(V_{GS} - V_T)^2 \quad (1)$$

where $I_D$ is the transistor drain current, K is a process related constant, W is the transistor width, L is the transistor length, $V_{GS}$ is the input voltage between the transistor gate and source, and $V_T$ is the constant transistor threshold voltage. This model is applicable and the output impedance of the transistor is at its maximum, if the transistor is in its forward active mode (i.e., saturation region). The forward active mode is defined by the condition where the drain-to-source voltage $V_{DS}$ of the transistor is greater than the difference between the gate-to-source voltage $V_{GS}$ and the threshold voltage $V_T$ as represented by Equation (2) as follows:

$$V_{DS} > V_{GS} - V_T \quad (2)$$

The quantity $V_{GS} - V_T$ is often called the "on" voltage $V_{ON}$ for the transistor. The constant voltage $V_T$ in Equation (1) can be generated by taking advantage of the equation's square law characteristic. Rearranging terms yields Equation (3) as follows:

$$V_{GS} = V_T + \sqrt{\frac{I_D}{K(W/L)}} \quad (3)$$

If the quantity $I_D/(W/L)$ is called the current density J of the transistor, then Equation (3) can be rewritten as Equation (4) as follows:

$$V_{GS} = V_T + \sqrt{1/K} \sqrt{J} \quad (4)$$

If two transistors are operated such that the current density for the first transistor is $n^2$ times the current density for the second transistor (where n is an integer), then Equations (5) and (6) will describe the gate-to-source voltages $V_{GS}$ of the two transistors, as follows:

$$V_{GS1} = V_T + \sqrt{1/K} \sqrt{J} \quad (5)$$

$$V_{GS2} = V_T + \sqrt{1/K} \sqrt{n^2 J} = V_T + n\sqrt{1/K} \sqrt{J} \quad (6)$$

Multiplying $V_{GS1}$ of Equation (5) by n and then subtracting $V_{GS2}$ of Equation (6) yields Equation (7) as follows:

$$nV_{GS1} - V_{GS2} = (n-1)V_T \quad (7)$$

For n=2, Equation (7) can be expressed as Equation (8) as follows:

$$V_T = 2V_{GS1} - V_{GS2} \quad (8)$$

Figure 2:
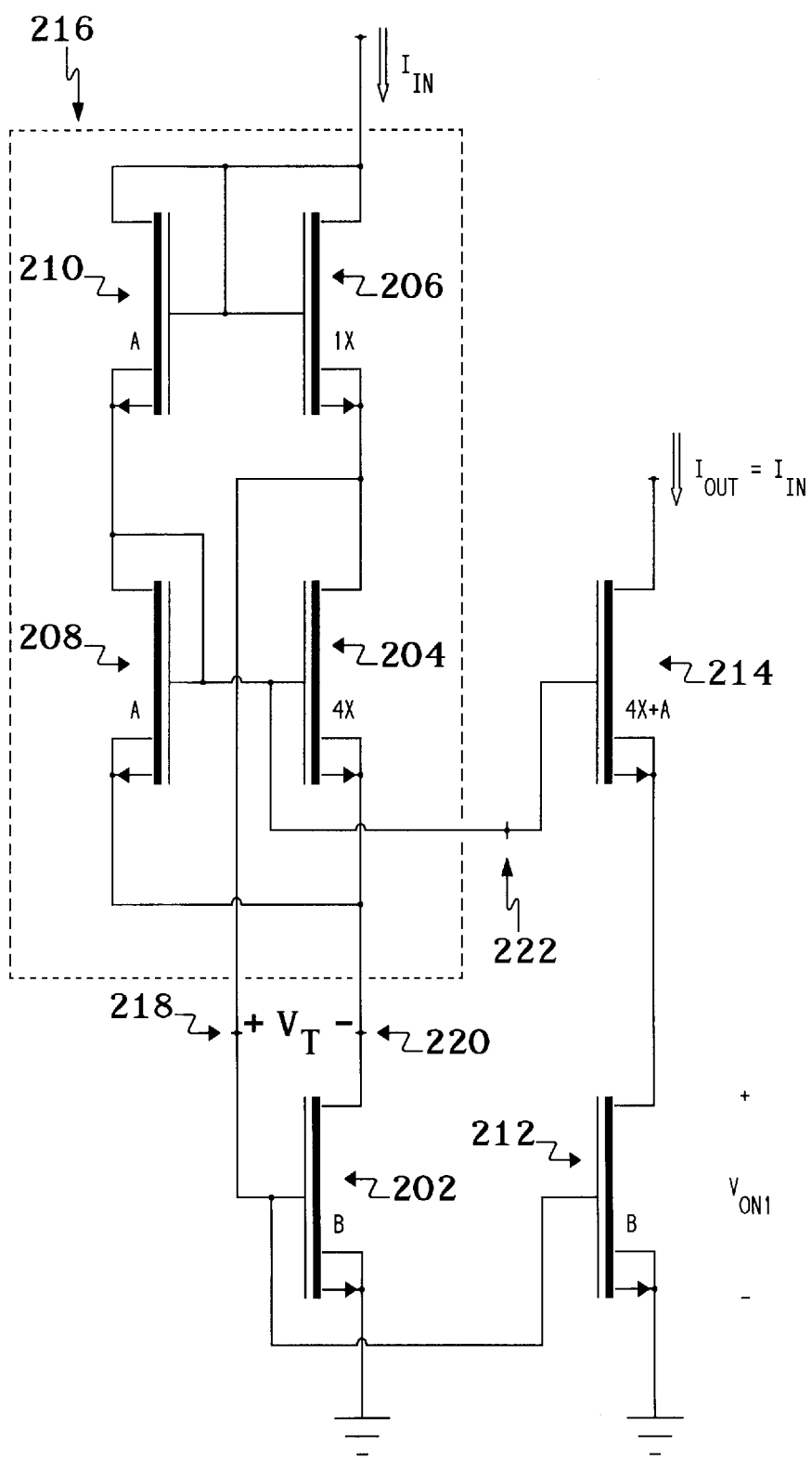
FIGS. 2–4, 5a, 5b, 6a, 6b 7a, 7b, 8a and 8b show representations of current mirrors, according to different embodiments of the present invention.

FIG. 2 shows a representation of current mirror 200, according to one embodiment of the present invention. Current mirror 200 comprises MOS transistors 202–214. Transistors 202–210 are configured to operate as the input circuit branch of current mirror 200 and transistors 212–214 are configured to operate as the output circuit branch of current mirror 200. Within the input circuit branch, transistor 202 operates as an input mirror device and transistors 204–210 operate as a threshold voltage generator (216). Threshold voltage generator 216 comprises two parallel current paths, a first current path comprising transistors 204–206 and a second current path comprising transistors 208–210. Within the output circuit branch, transistor 212 operates as an output mirror device and transistor 214 operates as an output cascode device.

As shown in FIG. 2, transistor 202 is connected to threshold voltage generator 216 in cascode and transistor 212 is connected to transistor 214 in cascode. In particular:
  The source of transistor 202 is connected to a common reference voltage (e.g., ground);
  The gate of transistor 202 is connected to an electrode (218) of threshold voltage generator 216;
  The drain of transistor 202 is connected to another electrode (220) of threshold voltage generator 216:
  Threshold voltage generator 216 is responsive to a single input signal current $I_{IN}$;
  The source of transistor 212 is connected to the common reference voltage;
  The gate of transistor 212 is connected to the gate of transistor 202 and to electrode 218 of threshold voltage generator 216;
  The drain of transistor 212 is connected to the source of transistor 214; and
  The gate of transistor 214 is connected to another electrode (222) of threshold voltage generator 216.

Threshold voltage generator 216 comprises four transistors 204–210 interconnected to form two parallel current paths. In particular:
  The source of transistor 204 is connected to the source of transistor 208 to form electrode 220;
  The gate of transistor 204 is connected to the gate and drain of transistor 208 and the source of transistor 210 to form electrode 222;
  The drain of transistor 204 is connected to the source of transistor 206 to form electrode 218; and
  The gates and drains of transistors 206 and 210 are all interconnected and are responsive to input signal current $I_{IN}$.

In a preferred embodiment, threshold voltage generator 216 is designed based on the relationships of Equations (1)–(8). In particular, width-to-length ratio W/L (i.e., the channel constant) of transistor 204 (X) is designed to be four times that of transistor 206 (4X). Transistors 204 and 206 are connected so that the same current passes through both, thereby forcing their output currents $I_D$ to be equal. As a result, the current density for transistor 206 will be approximately four times the current density for transistor 204. Transistors 208 and 210 are simple impedances that multiply the gate-to-source voltage $V_{GS}$ of transistor 204 by two and supply the result to the gate of transistor 206. The voltage at the source of transistor 204 is this voltage minus the gate-to-source voltage $V_{GS}$ of transistor 204. In this implementation, n=2 in Equation (7) and, therefore, Equation (8) applies. As such, a threshold voltage $V_T$ appears between node 218 and node 220. Furthermore, as described below, all transistors operate in the forward active mode.

Current mirror 200 operates by generating the threshold voltage $V_T$ by means of threshold voltage generator 216 and impressing it between the gate and drain of transistor 202. This critically biases transistor 202 at the threshold of saturation by subtracting the threshold voltage $V_T$ from its gate-to-source voltage $V_{GS}$ leaving a voltage $V_{ON1}$ at node 220, where $V_{ON1}$ is the "on" voltage for transistors 202 and 212 (i.e., the voltage at which transistors 202 and 212 operate in the forward active mode). The gate of transistor 214 is connected to the gates of transistors 204 and 208. Since the gate-to-source voltages $V_{GS}$ of transistors 204 and 208 are identical, the current density of transistor 204 is the same as the current density of transistor 208. As a result, if the current density of transistor 214 is the same as that of transistors 204 and 208, the voltage at the source of transistor 214 will also be $V_{ON1}$.

The current density of transistor 214 can be forced to the same value as that of transistors 204 and 208 by designing transistor 214 with a width-to-length ratio equal to the sum of the width-to-length ratios of transistor 204 (i.e., W/L=4X) and transistor 208 (i.e., W/L=A) and forcing its output current $I_D$ to be equal to the sum of the output currents of transistors 204 and 208. The sum of the output currents for transistors 204 and 208 is equal to the output current for transistor 202. Thus the objective can be met by mirroring the output current of transistor 202 by means of transistor 212 and supplying the current to transistor 214. Note that, in current mirror 200, the width-to-length ratio of transistor 202 is equal to the width-to-length ratio of transistor 212 (i.e., W/L=B). In alternative embodiments, multiples or fractions of the input signal current may be mirrored by scaling the width-to-length ratio of transistor 214 by the same multiple or fraction. In general, the width-to-length parameters X, A, and B in current mirror 200 can be all independent of one another.

Those skilled in the art will understand that the present invention may be implemented in embodiments differing from that of current mirror 200 of FIG. 2. For example, the input branch (comprising input mirror device 202 and threshold voltage generator 216) can be connected to two or more output branches, each of which comprises an output mirror device and an output cascode device analogous to transistors 212 and 214, respectively. In each of these output branches, (a) the source of the output mirror device is connected to the common reference voltage (e.g., ground), (b) the gate of the output mirror device is connected to the gate of input mirror device 202, (c) the drain of the output mirror device is connected to the source of the output cascode device, and (d) the gate of the output cascode device is connected to electrode 222 of threshold voltage generator 216. In operation, an output current $I_{OUT}$ proportional to input signal current $I_{IN}$ is generated at the drain of the output cascode device.

Figure 3:
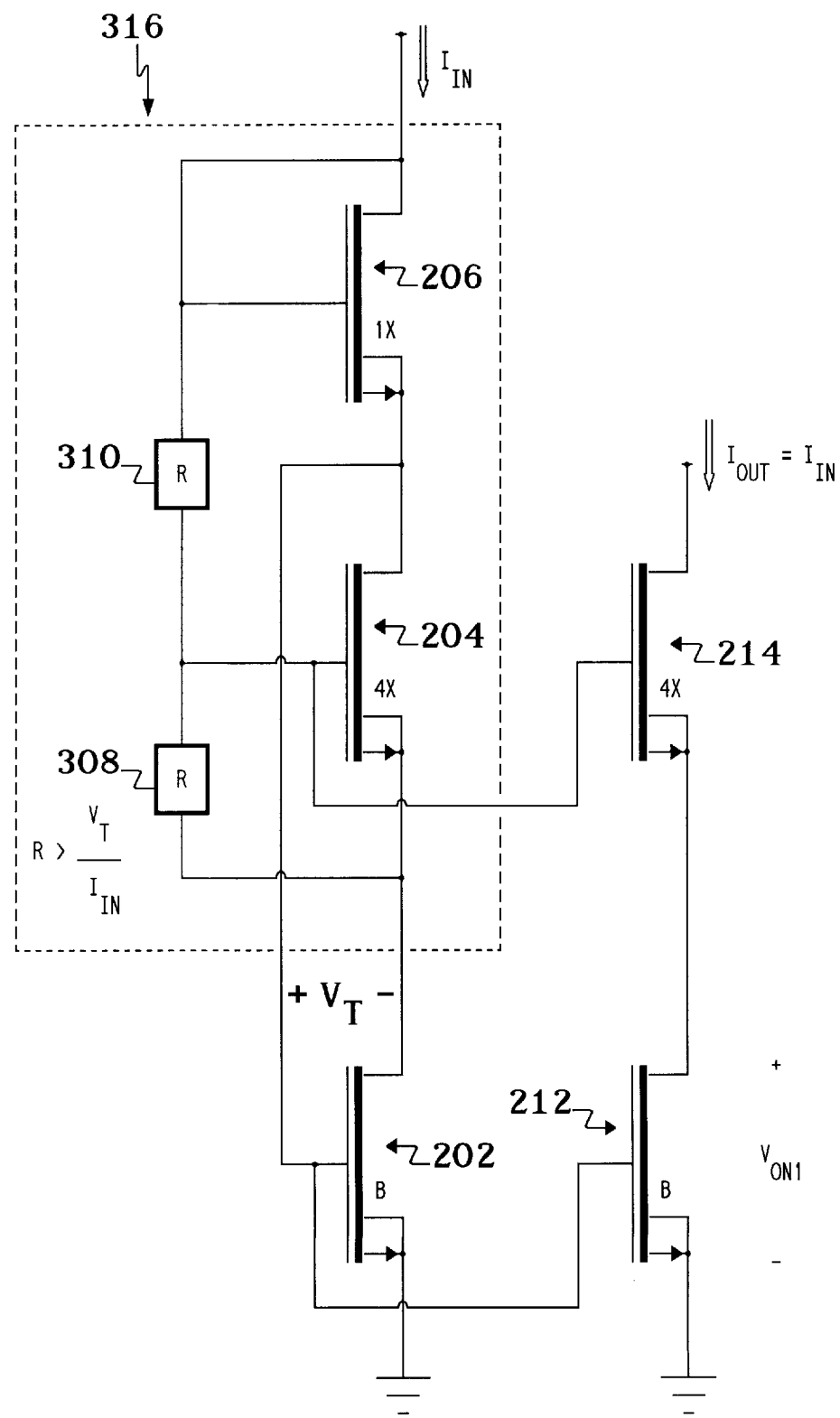

FIG. 3 shows a representation of current mirror 300, according to another alternative embodiment of the present invention. Current mirror 300 is similar to current mirror 200 of FIG. 2, except that threshold voltage generator 216 is replaced by threshold voltage generator 316 and the width-to-length ratio W/L for the output cascode transistor (214) is 4X instead of 4X+A. In threshold voltage generator 316 impedances 308 and 310 replace transistors 208 and 210, respectively, of FIG. 2. Impedances 308 and 310 perform a similar scaling function as transistors 208 and 210. That is, they multiple the gate-to-source voltage $V_{GS}$ of transistor 204 by two and supply the result to the gate of transistor 206.

In the case of current mirror 200 of FIG. 2, the current through transistor 208 subtracts from the current through transistor 204. This reduction in current density is compensated for by designing transistor 214 with a width-to-length ratio W/L equal to 4X+A. When impedances 308 and 310 of FIG. 3 replace transistors 208 and 210 of FIG. 2, as in current mirror 300, the reduced current density in transistor 204 is not as easily compensated for and an error in the voltage at the drain of transistor 212 results. If impedances 308 and 310 are large, then this error is small and may be neglected.

Figure 4:
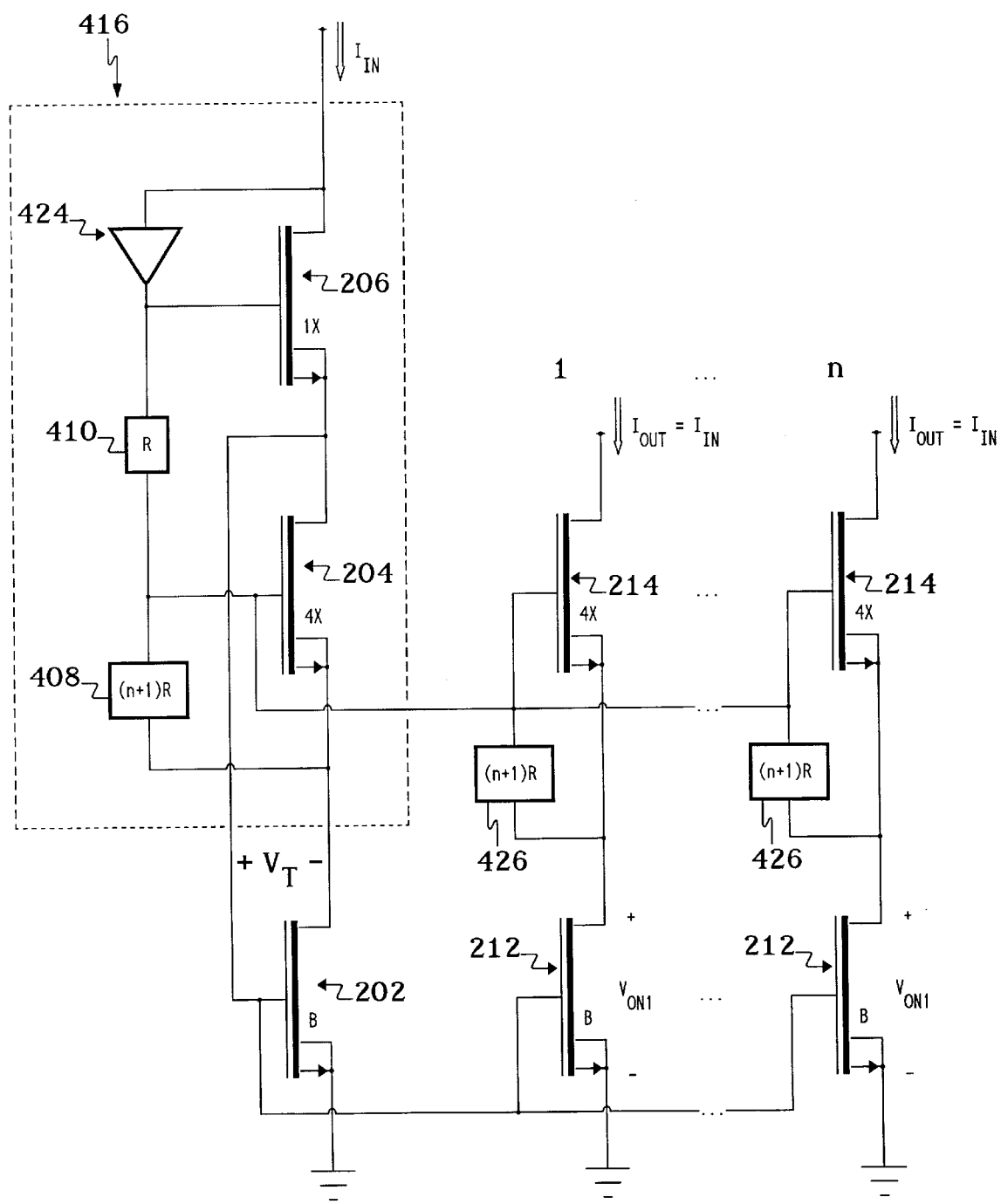

FIG. 4 shows a representation of current mirror 400, according to yet another alternative embodiment of the present invention. Current mirror 400 is similar to current mirror or 300 of FIG. 3, except that the effect of impedances 408 and 410 on current density is compensated for through the doubling of impedance 408 relative to impedance 410 and through the addition of impedance 426 and buffer amplifier 424. In current mirror 400, the current densities of transistors 204 and 214 match, thereby creating a voltage of exactly one $V_{ON1}$ at the drain of transistor 214, where $V_{ON1}$ refers to the "on" voltage of transistors 202 and 212. In general, in order to ensure proper operations, when there are n output branches, impedances 408 and 426 are selected to be approximately (n+1) times impedance 410. Buffer amp 424 provides current isolation and may be replaced by other devices that perform the same function, such as an emitter-follower or source-follower transistor.

Figure 5A:
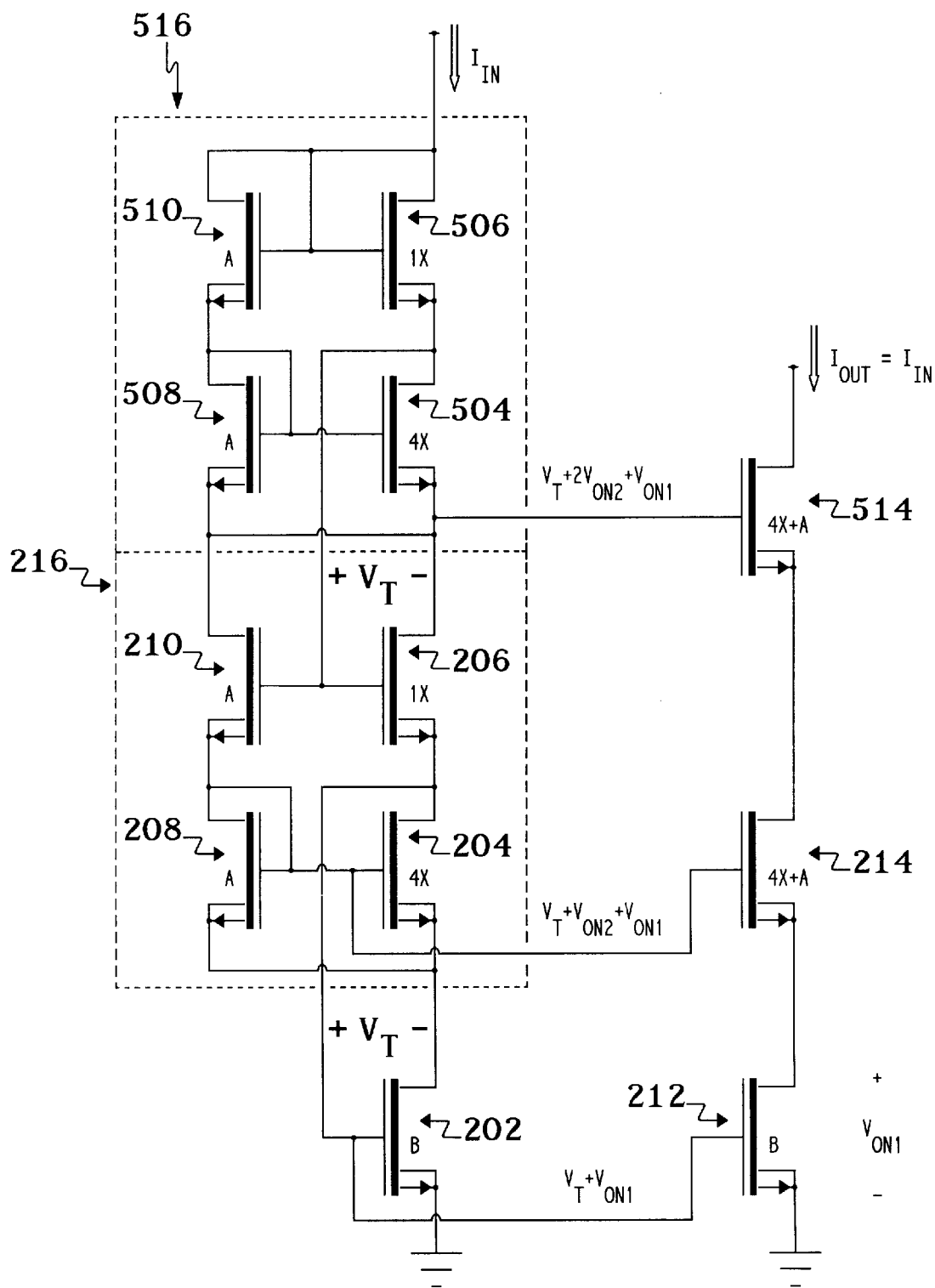

FIG. 5a shows a representation of current mirror 500, according to a further alternative embodiment of the present invention. Current mirror 500 extends the principle of current mirror 200 of FIG. 2 to two output cascode transistors (214 and 514) instead of one (214). Here an additional threshold voltage generator 516 is placed over threshold voltage generator 216 and the gates of transistors 206 and 210 are connected to a node whose voltage is one threshold voltage $V_T$ above their drains. The voltage produced at the drains of transistors 206 and 210 is the appropriate value that, with the addition of output cascode transistor 514, yields a voltage of $V_{ON2}+V_{ON1}$ at the drain of transistor 214. where $V_{ON2}$ refers to the "on" voltage of transistors 204, 208, 214, 504, 508, and 514 and $V_{ON1}$ refers to the "on" voltage of transistors 202 and 212.

Figure 5B:
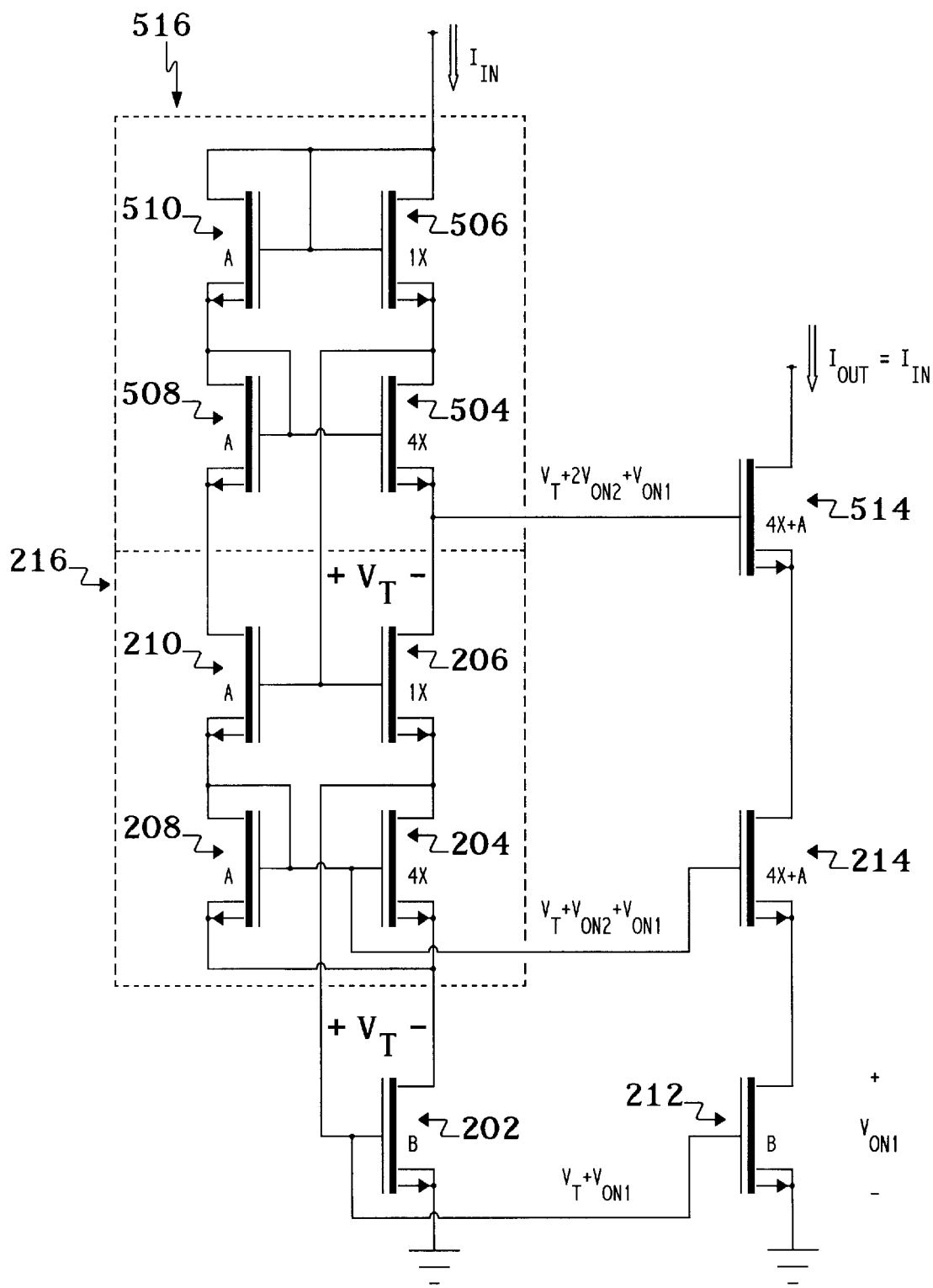

If the connection between the sources of transistors 504 and 508 is removed, then the transistors' current densities will not change by virtue of transistors 204 and 208. Therefore, the connection between the sources of transistors 504 and 508 may be removed without affecting the voltage at their sources as shown in FIG. 5b.

Figure 6A:
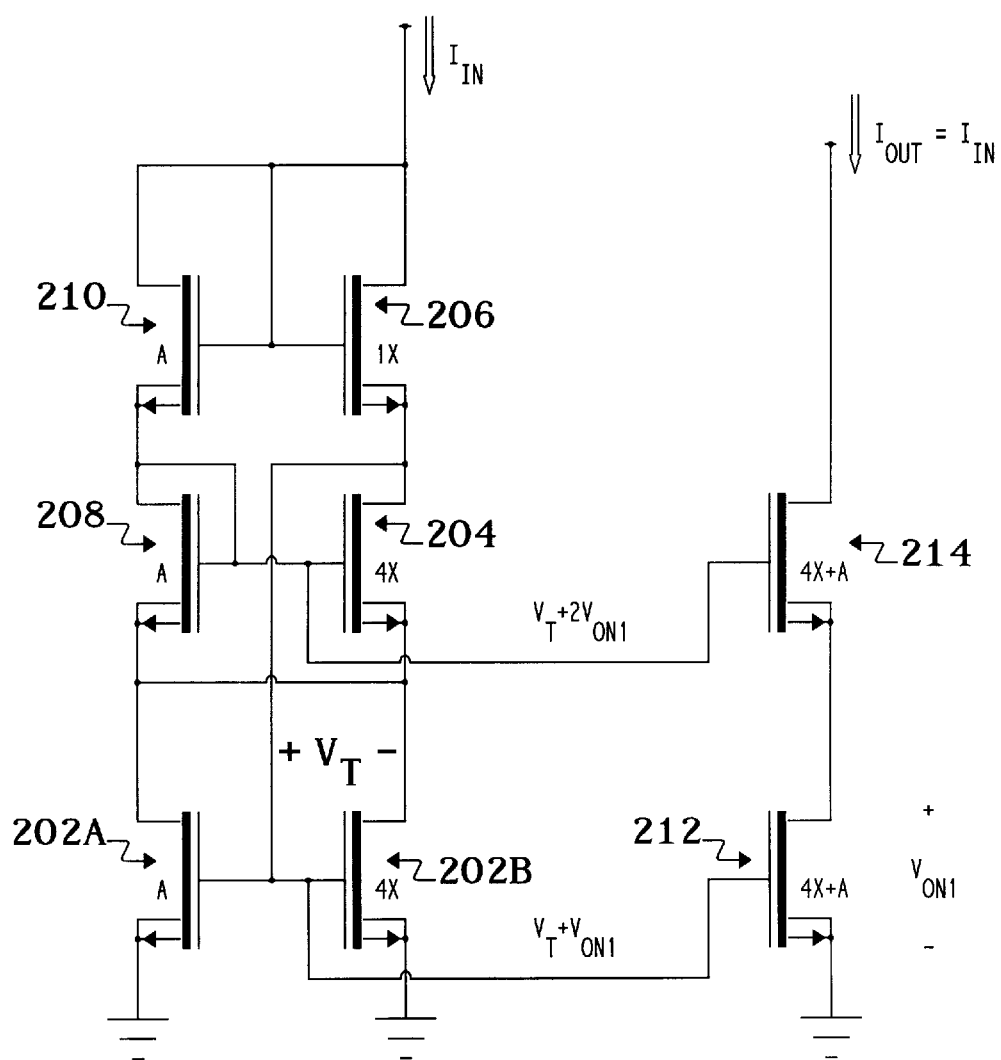
Figure 6B:
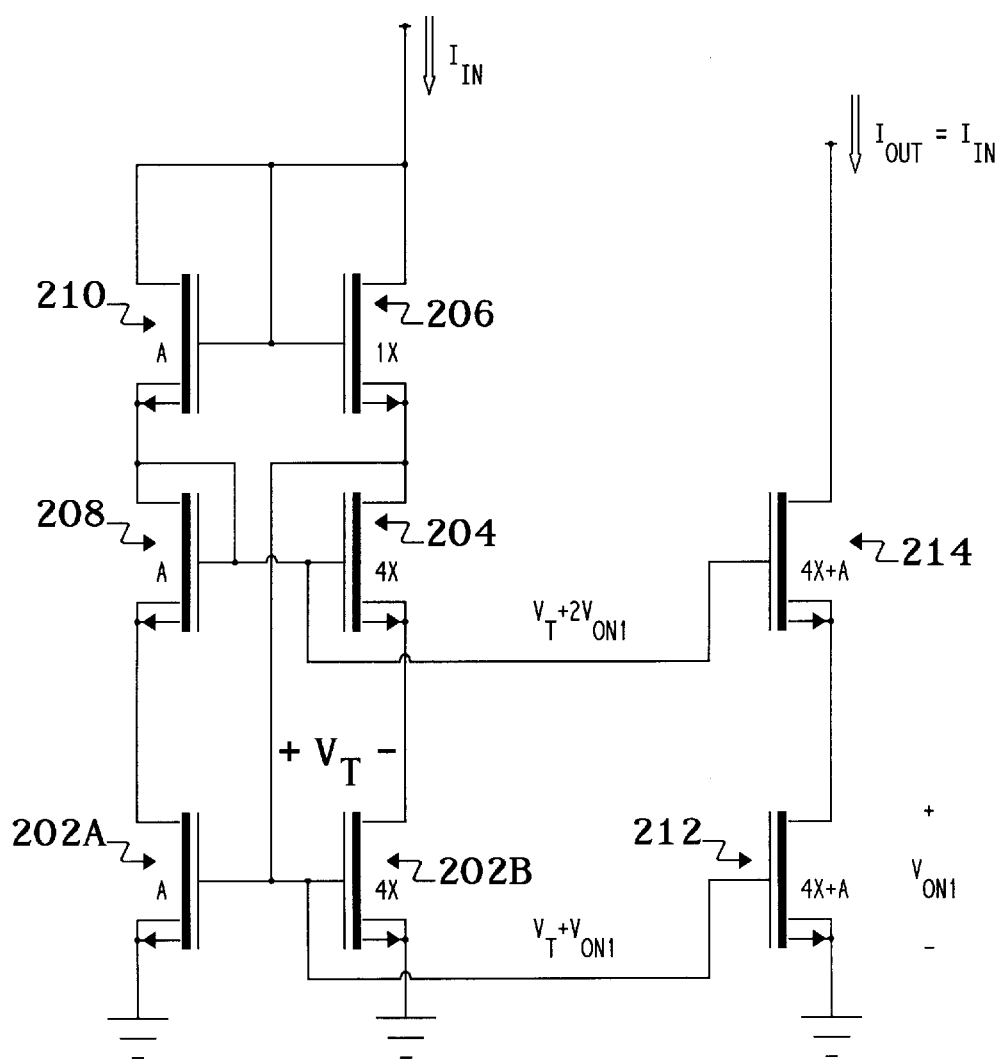

FIG. 6a shows a representation of current mirror 600, according to another alternative embodiment of the present invention. Current mirror 600 is similar to current mirror 200 of FIG. 2, except that the width-to-length ratio of transistors 202 and 212 of FIG. 2 is set equal to 4X+A. For convenience, transistor 202 of FIG. 2 has been split into transistors 202A and 202B of FIG. 6a. Since the current densities of transistors 204 and 208 can be forced to the same value by virtue of transistors 202A and 202B, the connection between their sources may be removed as shown in FIG. 6b.

Figure 7A:
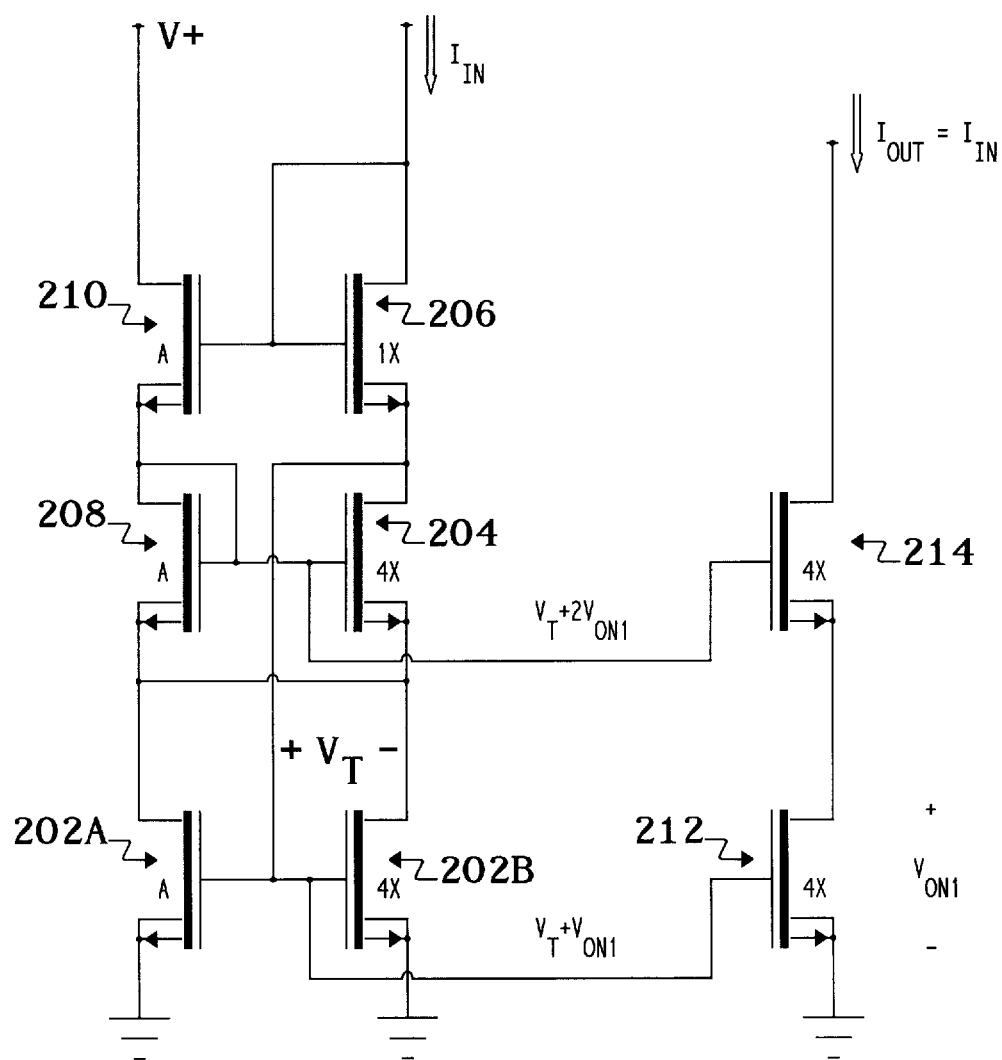
Figure 7B:
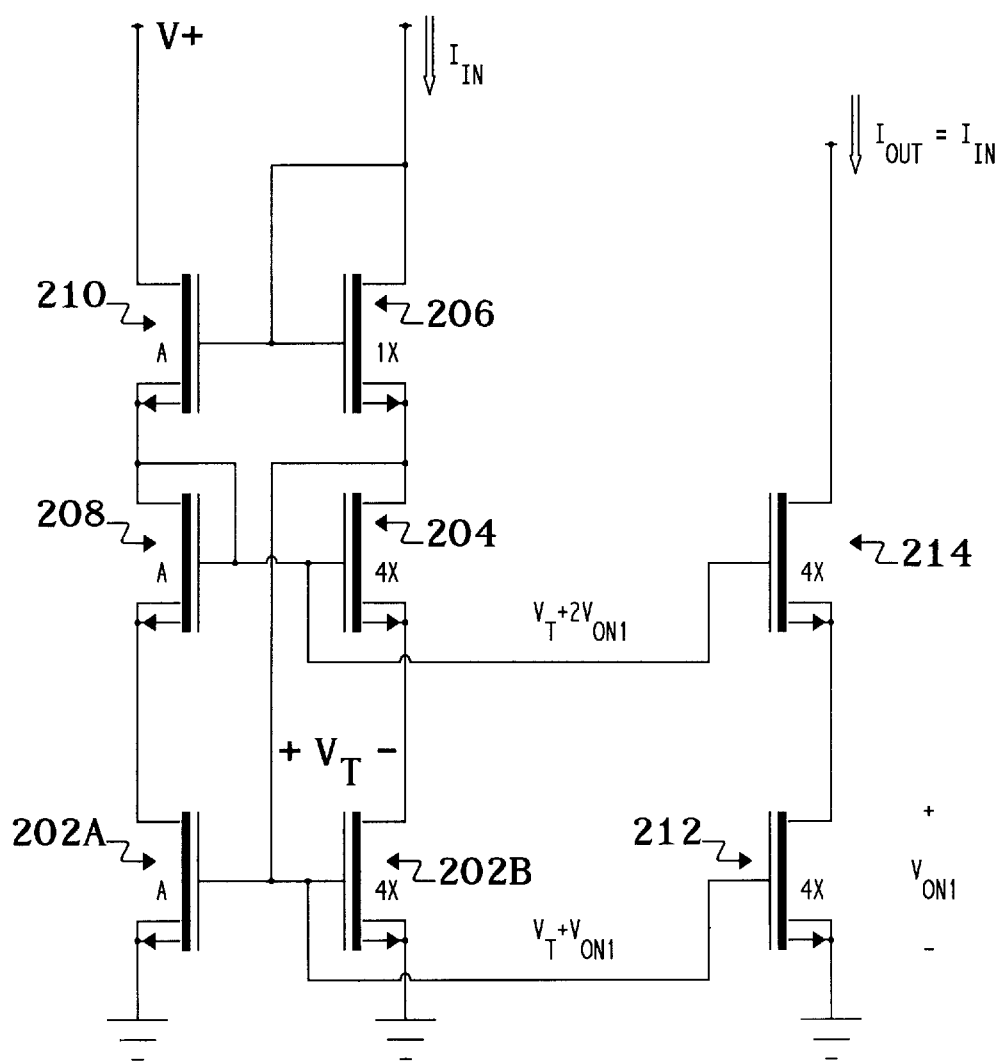

FIG. 7a shows a representation of current mirror 700, according to another alternative embodiment of the present invention. Current mirror 700 is similar to current mirror 600 of FIGS. 6a–b, except that the drain of transistor 210 is connected to a positive voltage supply. This architecture forces the totality of the input signal current $I_{IN}$ to flow through transistors 202B and 204 so that the mirrored output current $I_{OUT}$ will equal the input signal current $I_{IN}$ when transistors 212 and 214 have width-to-length ratios of 4X. Here, too, the connection between the sources of transistors 204 and 208 may be removed as shown in FIG. 7b.

Figure 8A:
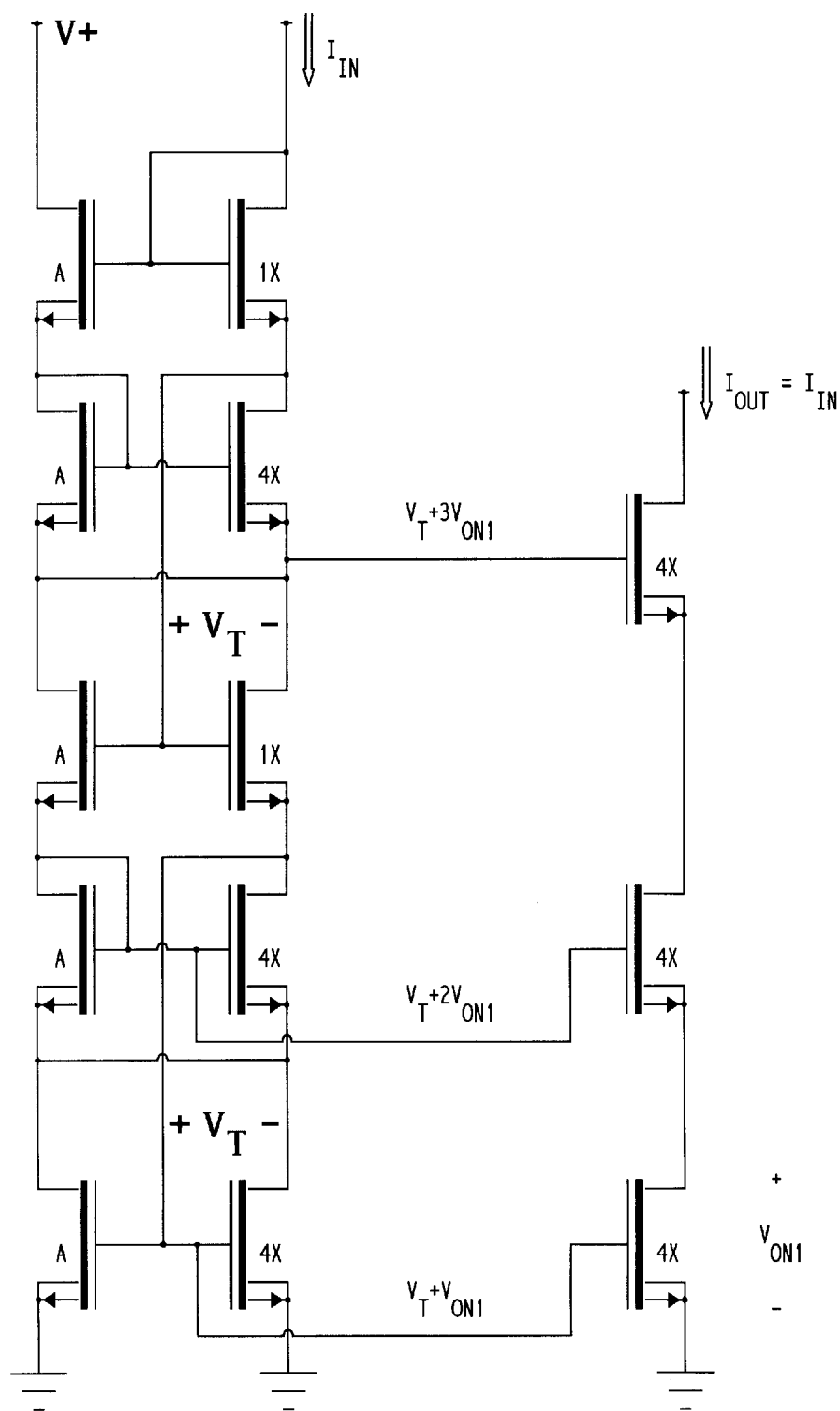
Figure 8B:
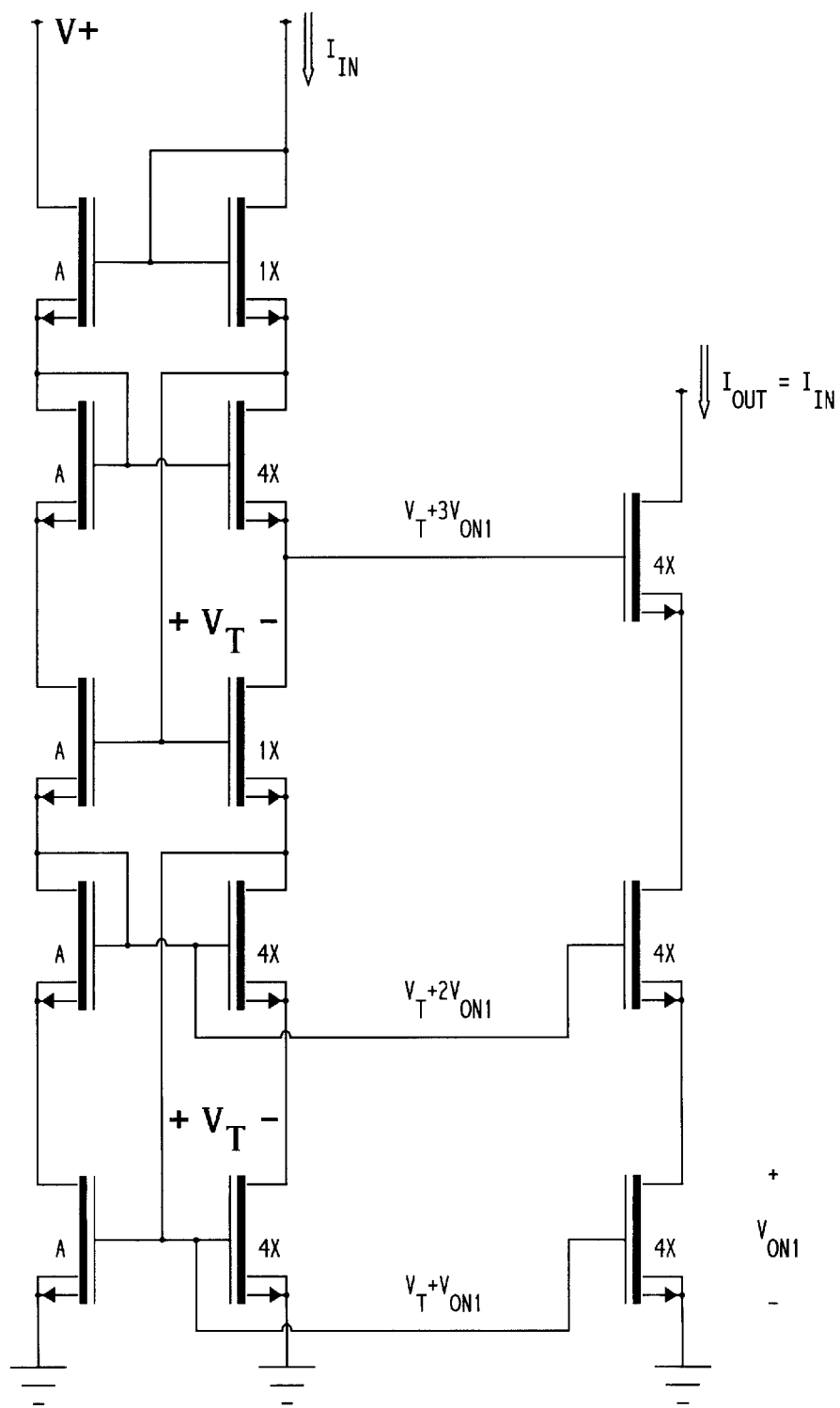

FIG. 8a shows a representation of current mirror 800, according to another alternative embodiment of the present invention. Current mirror 800 applies the principles embodied in current mirror 700 of FIGS. 7a–b to the two-cascode scheme of current mirror 500 of FIGS. 5a–b. As before, redundant connections between transistor sources may be removed as shown in FIG. 8b.

Those skilled in the art will understand that current mirrors according to the present invention can be implemented using threshold voltage generators different from those shown in FIGS. 2–8b. For example, current mirrors of the present invention can be implemented with any threshold voltage generator that provides the appropriate voltages at electrodes 218–222 of FIG. 2.

In still other embodiments of the present invention, current mirrors can be implemented with input mirror devices, output mirror devices, and/or output cascode devices different from those shown in FIGS. 2–8b.

In the embodiments described above, the current mirrors of the present invention are based on MOS transistor technology. Those skilled in the art will understand that the present invention may alternatively be implemented using other devices that obey a square law characteristic similar to that of Equation (1).

The use of figure reference labels in the claims is intended to identify one or more possible embodiments of the claimed subject matter in order to facilitate the interpretation of the claims. Such labeling is not to be construed as necessarily limiting the scope of those claims to the embodiments shown in the corresponding figures.

It will be further understood that various changes in the details, materials, and arrangements of the parts which have been described and illustrated in order to explain the nature of this invention may be made by those skilled in the art without departing from the principle and scope of the invention as expressed in the following claims. In the claims, reference numerals are used to identify examples of the recited elements in the preferred embodiments disclosed in the specification. The use of such reference numerals is not intended to limit the scope of the claims in any way.

What is claimed is:

1. A current mirror having an input circuit branch and an output circuit branch, wherein:

the input branch is responsive to a single input signal current;

the output branch mirrors the input signal current to produce an output current substantially proportional to the input signal current;

the input branch comprises:

(a) an input mirror device; and
(b) a threshold voltage generator, connected to the input mirror device;

the output branch comprises:

(a) an output mirror device; and
(b) an output cascode device, connected in cascode with the output mirror device; and the input mirror device, the output mirror device, and the output cascode device all operate in saturation.

2. The invention of claim 1, wherein:

each of the input mirror device, the output mirror device, and the output cascode device comprises an MOS transistor having a gate, a source, and a drain;

the gate of the input mirror device is connected to both the gate of the output mirror device and a first electrode of the threshold voltage generator;

the drain of the input mirror device is connected to a second electrode of the threshold voltage generator;

the gate of the output cascode device is connected to a third electrode of the threshold voltage generator; and the source of the output cascode device is connected to the drain of the output mirror device.

3. The invention of claim 2, wherein:

the threshold voltage generator comprises a first current path and a second current path;

the first current path comprises a first transistor and a second transistor, each having a gate, a source, and a drain;

the drain and the gate of the second transistor are interconnected and are responsive to the input signal current;

the source of the second transistor is connected to both the drain of the first transistor and the first electrode;

the gate of the first transistor is connected to the third electrode; and the source of the first transistor is connected to the second electrode.

4. The invention of claim 3, wherein:

the second current path comprises a third transistor and a fourth transistor, each having a gate, a source, and a drain;

the drain and the gate of the fourth transistor are connected to the gate of the second transistor; and the source of the fourth transistor and the drain and the gate of the third transistor are connected to the gate of the first transistor.

5. The invention of claim 4, wherein the source of the third transistor is connected to the source of the first transistor.

6. The invention of claim 4, wherein:

the first transistor has a channel constant of 4X;

the second transistor has a channel constant of approximately X;

the third transistor has a channel constant of A;

the fourth transistor has a channel constant of approximately A;

the input mirror device has a channel constant of B;

the output mirror device has a channel constant of approximately B; and the output cascode device has a channel constant of approximately 4X+A.

7. The invention of claim 4, wherein:

the first transistor has a channel constant of 4X;

the second transistor has a channel constant of approximately X;

the third transistor has a channel constant of A;

the fourth transistor has a channel constant of approximately A;

the input mirror device comprises a first input mirror transistor having a channel constant of approximately A and a second input mirror transistor having a channel constant of approximately 4X;

the output mirror device has a channel constant of approximately 4X+A; and the output cascode device has a channel constant of approximately 4X+A.

8. The invention of claim 3, wherein:

the second current path comprises a third transistor and a fourth transistor, each having a gate, a source, and a drain;

the drain of the fourth transistor is adapted to be connected to a voltage supply;

the gate of the fourth transistor is connected to the gate of the second transistor;

the source of the fourth transistor and the drain and the gate of the third transistor are connected to the gate of the first transistor;

the input mirror device comprises a first input mirror transistor and a second input mirror transistor;

the source of the third transistor is connected to the drain of the first input mirror transistor;

the gate of the first input mirror transistor is connected to the gate of the second input mirror transistor, to the first electrode, and to the gate of the output mirror device; and the drain of the second input mirror transistor is connected to the second electrode.

9. The invention of claim 8, wherein:

the first transistor has a channel constant of 4X;

the second transistor has a channel constant of approximately X;

the third transistor has a channel constant of A;

the fourth transistor has a channel constant of approximately A;

the first input mirror transistor has a channel constant of approximately A;

the second input mirror transistor has a channel constant of approximately 4X;

the output mirror device has a channel constant of approximately 4X+A; and the output cascode device has a channel constant of approximately 4X+A.

10. The invention of claim 3, wherein:

the second current path comprises a first impedance and a second impedance;

the second impedance is connected across the gate of the second transistor and the gate of the first transistor; and the first impedance is connected across the gate and the source of the first transistor.

11. The invention of claim 10, further comprising a current buffer between the drain and the gate of the second transistor and a third impedance between the third electrode and the source of each output cascode device, wherein there are sn output branches and the first impedance is approximately (n+1) times the second impedance.

12. The invention of claim 1, wherein:

the output branch further comprises an other output cascode device, connected in cascode with the output cascode device; and the input branch further comprises an other threshold voltage generator, connected to the threshold voltage generator and adapted to provide a voltage to the other output cascode device.

13. A current mirror, having an input circuit branch and an output circuit branch, wherein:

the input branch is responsive to a single input signal current;

the output branch mirrors the input signal current to produce an output current substantially proportional to the input signal current;

the input branch comprises at least five input transistors, each input transistor having a gate, a source, and a drain, wherein:

(1) the drain of the first input transistor is connected to the source of the second input transistor and the source of the fourth input transistor;

(2) the gate of the first input transistor is connected to both the drain of the second input transistor and the source of the third input transistor;

(3) the gate of the second input transistor is connected to the gate of the fourth input transistor, the drain of the fourth input transistor, and the source of the fifth input transistor; and (4) the gate and the drain of the third input transistor and the gate and the drain of the fifth input transistor are interconnected and are responsive to the input signal current; and the output branch comprises a first output transistor connected in cascode to a second output transistor, each output transistor having a gate, a source, and a drain, wherein:

(1) the gate of the first output transistor is connected to the gate of the first input transistor;

(2) the drain of the first output transistor is connected to the source of the second output transistor; and (3) the gate of the second output transistor is connected to the gate of the second input transistor.

14. The invention of claim 13, wherein the input and output transistors all operate in saturation, the output cascode transistor (e.g., 214) has a channel constant of approximately 4X+A.

15. The invention of claim 13, wherein, when operated, the voltage at the drain of the second input transistor is such that:

the voltage between the drain and the source of the second input transistor and the voltage between the drain and the source of the second output transistor are both approximately equal to a transistor threshold voltage; and the voltage between the drain and the source of the first input transistor and the voltage between the drain and the source of the first output transistor are both approximately equal to a transistor "on" voltage.

16. The invention of claim 13, wherein:

the first input transistor has a channel constant of B;

the third input transistor has a channel constant of X;

the second input transistor has a channel constant of approximately 4X;

the fourth input transistor has a channel constant of A;

the fifth input transistor has a channel constant of approximately A;

the first output transistor has channel constant of approximately B; and the second output transistor has a channel constant of approximately 4X+A.

17. A current mirror having an input circuit branch and an output circuit branch, wherein:

the input branch is responsive to a single input signal current;

the output branch mirrors the input signal current to produce an output current substantially proportional to the input signal current;

the input branch comprises:
   (a) an input mirror transistor; and
   (b) a threshold voltage generator, connected in cascode to the input mirror transistor and comprising at least four generator transistors;

the output branch comprises:
   (a) an output mirror transistor; and
   (b) an output cascode transistor, connected in cascode with the output mirror transistor; and the input mirror transistor has a channel constant of B;

the first generator transistor has a channel constant of 4X;

the second generator transistor has a channel constant of approximately X;

the third generator transistor has a channel constant of A;

the fourth generator transistor has a channel constant of approximately A;

the output mirror transistor has channel constant of approximately B; and the output cascode transistor has a channel constant of approximately 4X+A.

18. The invention of claim 17, wherein all of the transistors are MOS transistors that operate in saturation.

\* \* \* \* \*

UNITED STATES PATENT AND TRADEMARK OFFICE
CERTIFICATE OF CORRECTION

PATENT NO.   : 5,867,067
DATED        : February 2, 1999
INVENTOR(S)  : John K. Moriarty Page 1 of 1

It is certified that error appears in the above-identified patent and that said Letters Patent is hereby corrected as shown below:

Column 10,
Lines 44-46, replace "saturation, the output cascode transistor (e.g., 214) has a channel constant of approximately 4X+A." with -- saturation.--.

Signed and Sealed this

Twenty-first Day of August, 2001

*Attest:*

*Attesting Officer*

NICHOLAS P. GODICI
*Acting Director of the United States Patent and Trademark Office*